(12) United States Patent
Tanaka (10) Patent No.: US 6,638,865 B2
(45) Date of Patent: Oct. 28, 2003

(54) MANUFACTURING METHOD OF SEMICONDUCTOR CHIP WITH ADHESIVE AGENT

(75) Inventor: Kazuyasu Tanaka, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/962,499

(22) Filed: Sep. 25, 2001

(65) Prior Publication Data

US 2002/0042189 A1 Apr. 11, 2002

(30) Foreign Application Priority Data

Oct. 10, 2000 (JP) .................................... 2000-309742

(51) Int. Cl.⁷ ............................................. H01L 21/00
(52) U.S. Cl. ....................................... 438/692; 438/459
(58) Field of Search ............................... 438/460–465, 438/977, 114, 458–459, 690–692, 745, 753

(56) References Cited

U.S. PATENT DOCUMENTS

| | | | |
|---|---|---|---|
| 4,722,130 A | | 2/1988 | Kimura et al. |
| 5,888,883 A | * | 3/1999 | Sasaki et al. ................ 438/460 |
| 6,083,811 A | * | 7/2000 | Riding et al. ................ 438/460 |
| 6,371,840 B1 | * | 4/2002 | Ball et al. .................... 451/364 |
| 6,398,892 B1 | * | 6/2002 | Noguchi et al. .............. 156/85 |
| 6,447,898 B1 | * | 9/2002 | Pfaff .......................... 428/346 |
| 2002/0004288 A1 | * | 1/2002 | Nishiyama .................. 438/464 |
| 2002/0019074 A1 | * | 2/2002 | Nakazawa et al. .......... 438/107 |
| 2002/0037631 A1 | * | 3/2002 | Mimata ....................... 438/460 |

* cited by examiner

Primary Examiner—David Nelms
Assistant Examiner—David Vu
(74) Attorney, Agent, or Firm—Frommer Lawrence & Haug LLP; Grace L. Pan

(57) ABSTRACT

A semiconductor wafer on which elements have been formed is diced and a rear surface of the semiconductor wafer is ground by a dicing before grinding method to form discrete semiconductor chips. The discrete semiconductor chips are adhered to an adhesive film and then the surface of the adhesive film is removably affixed to a dicing tape. After this, any excess portions of the adhesive film disposed between the respective semiconductor chips are removed.

4 Claims, 6 Drawing Sheets

MANUFACTURING METHOD OF SEMICONDUCTOR CHIP WITH ADHESIVE AGENT

CROSS-REFERENCE TO RELATED APPLICATIONS

This application is based upon and claims the benefit of priority from the prior Japanese Patent Application No. 2000-309742, filed Oct. 10, 2000, the entire contents of which are incorporated herein by reference.

BACKGROUND OF THE INVENTION

1. Field of the Invention

This invention relates to a manufacturing method of a semiconductor device and more particularly to a method applied to a manufacturing process of a semiconductor chip obtained by adhering a film-like die bonding agent to a semiconductor chip which is made thin and formed into a discrete form by a dicing before grinding method.

2. Description of the Related Art

In order to simplify the step of mounting a semiconductor chip (pellet) on a metal frame or a printed circuit board such as organic substrate, a semiconductor chip having a film-like die bonding agent adhered to the rear surface thereof or a so-called semiconductor chip with an adhesive agent is used.

Figure 1A:
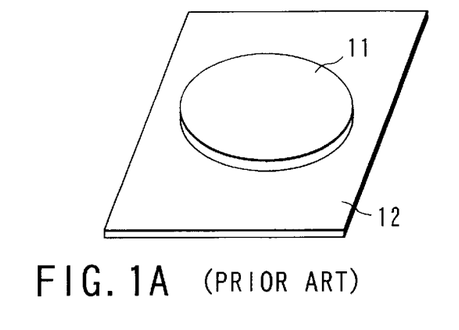
FIGS. 1A to 1E are perspective views for illustrating a conventional manufacturing method of a semiconductor device for forming semiconductor chips with adhesive agents.

Conventionally, the semiconductor chip with the adhesive agent is formed by the steps as shown in FIGS. 1A to 1E. That is, first, as shown in FIG. 1A, a film-like adhesive agent (adhesive film) 12 is adhered by laminating, for example, to the entire portion of the rear surface (the rear surface opposite to the element forming surface) of a semiconductor wafer 11 in which formation of elements is completed.

Figure 1B:
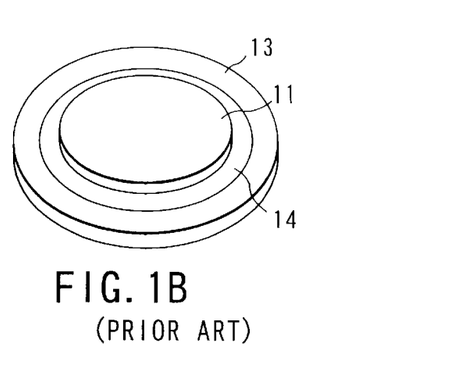

Then, after a portion of the adhesive film 12 which is not adhered to the wafer 11 is removed, an adhesive film surface thereof is adhered to a dicing tape 14 mounted on a wafer ring 13 as shown in FIG. 1B.

Figure 1C:
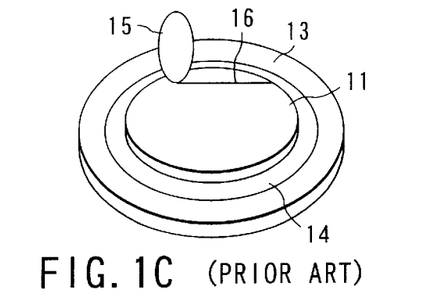

After this, as shown in FIG. 1C, the wafer 11 is diced together with the adhesive film 12 along dicing lines 16 by use of a dicer 15.

Figure 1D:
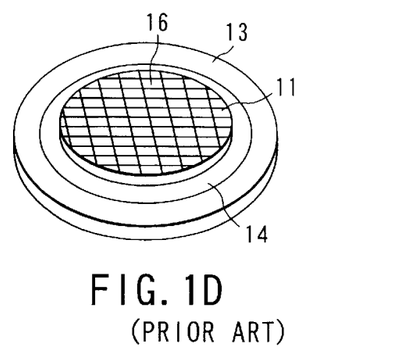
Figure 1E:
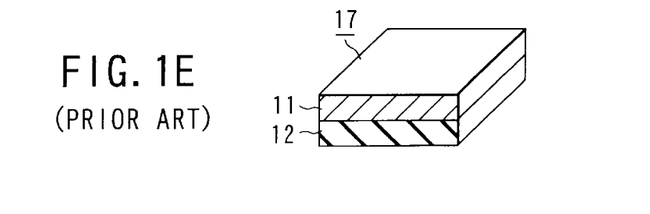

Next, as shown in FIG. 1D, each of semiconductor chips is picked up by use of a pickup needle, for example, from the wafer which has been diced and formed into a discrete form and a semiconductor chip 17 with an adhesive agent is formed as shown in FIG. 1E.

Then, the surface of the semiconductor chip 17 with the adhesive agent on the adhesive film 12 side is pressed against a metal frame or a printed circuit board such as organic substrate and it is mounted on the metal frame or organic substrate.

In recent years, it is desired to make thin the semiconductor chip in order to mount the semiconductor chip on a card-like thin package or reduce the mounting area by stacking and mounting a plurality of semiconductor chips. However, if the rear surface of the wafer on which elements have been formed is ground to make the wafer thin and the wafer which is made thin is diced and divided into individual semiconductor chips, the wafer may be cracked or the rear surface chipping occurs at the time of dicing or transfer of the wafer between the steps.

A method for suppressing breakage of the wafer or occurrence of the rear surface chipping caused by making the semiconductor chip thin to a minimum degree is a dicing before grinding (DBG which is an abbreviation of Dicing Before Grinding) method described in U.S. Pat. No. 4,722,130, for example. In the dicing before grinding method, the wafer is simultaneously made thin and formed into a discrete from by grinding the rear surface of the wafer after cuts (grooves) are made to a preset depth in the element forming surface of the wafer.

However, in order to form the semiconductor chips with the adhesive agent described above by use of the semiconductor chips which are made thin and formed into a discrete form by the dicing before grinding method, it becomes necessary to adhere an adhesive film to the divided semiconductor chips by laminating, for example, and then dice only the adhesive film, and thus the manufacturing process becomes complicated.

Figure 2A:
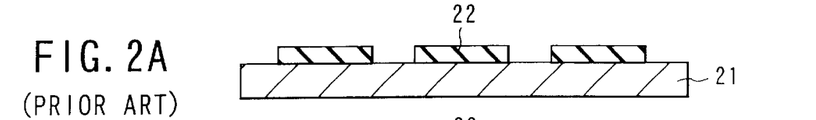
FIGS. 2A and 2B are cross sectional views for illustrating another conventional manufacturing method of a semiconductor device for forming semiconductor chips with adhesive agents, the manufacturing method being applied to a semiconductor chip formed by a dicing before grinding method.
Figure 2B:
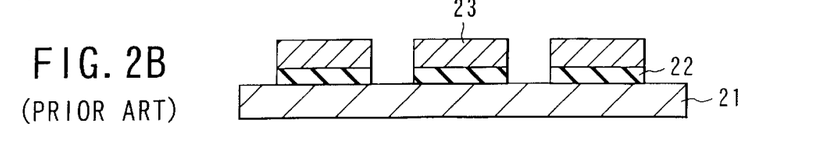

To prevent the manufacturing process from becoming complicated, a manufacturing method as shown in FIGS. 2A and 2B is proposed. In the method, as shown in FIG. 2A, adhesive films 22 having substantially the same size as the semiconductor chip are previously affixed to a portion of a metal frame or a printed circuit board such as organic substrate 21 on which the semiconductor chip will be die-mounted.

Next, as shown in FIG. 2B, semiconductor chips 23 are pressed against and die-bonded on and mounted on the respective adhesive films 22.

However, with the above manufacturing method, since the adhesive films 22 and semiconductor chips 23 are separately pressed against, positional deviation tends to occur between the adhesive film 22 and the semiconductor chip 23. Therefore, there occurs a problem that the precision of the mounting position is lowered. Accordingly, it becomes necessary to newly introduce a highly precise film sticking machine or the like in order to press the adhesive films 22 against and mount the same on the metal frame or printed circuit board 21 with high positioning precision.

As described above, the conventional manufacturing method of the semiconductor device for forming the semiconductor chip with the adhesive agent has a problem that the manufacturing process becomes complicated if the dicing before grinding method is used. Further, if an attempt is made to prevent the manufacturing process from becoming complicated, positional deviation tends to occur between the adhesive film and the semiconductor chip, the precision of the mounting position is lowered and a highly precise film sticking machine is required.

BRIEF SUMMARY OF THE INVENTION

According to an aspect of the present invention, there is provided a method for manufacturing a semiconductor device comprising: dicing a semiconductor wafer on which elements have been formed and grinding a rear surface of the semiconductor wafer by a dicing before grinding method to form discrete semiconductor chips; adhering each of the discrete semiconductor chips to an adhesive film having a first surface and a second surface; the film comprising thermoplastic resin, unset thermosetting resin or a combination of thermoplastic resin and unset thermosetting resin, and the first surface of the adhesive film being adhered to the rear surface of the semiconductor chips; removably affixing the second surface of the adhesive film to a dicing tape; and removing any excess portions of the adhesive film disposed between the respective semiconductor chips.

According to another aspect of the present invention, there is provided a manufacturing method of a semiconductor device comprising: dicing a first surface of a semiconductor wafer on which elements have been formed and grinding a rear surface of the semiconductor wafer by a dicing before grinding method to form discrete semiconductor chips; adhering each of the discrete semiconductor chips on an adhesive film which has a first surface and a second surface and a die bonding agent which comprises thermoplastic resin, unset thermosetting resin or a combination of thermoplastic resin and unset thermosetting resin, and is depolymerized by UV rays whereby a first surface of the adhesive film becomes adhered to the semiconductor chips; affixing to the second surface of the adhesive film a dicing tape; applying UV rays to the wafer from above to cause a depolymerization reaction on any excess portions of the adhesive film disposed between the respective semiconductor chips; and removing the depolymerized adhesive film.

According to still another aspect of the present invention, there is provided a manufacturing method of a semiconductor device comprising: dicing a semiconductor wafer on which elements have been formed and grinding a rear surface of the semiconductor wafer by a dicing before grinding method to form discrete semiconductor chips; adhering each of the discrete semiconductor chips on an adhesive film which has a first surface and a second surface and a die bonding agent which comprises thermoplastic resin, unset thermosetting resin or a combination of thermoplastic resin and unset thermosetting resin, and subjecting the excess adhesive film to crosslinking and polymerization reactions by applying UV rays; affixing the second surface of the adhesive film to a dicing tape; applying UV rays to the wafer from above to cause crosslinking and polymerization reactions in any portions of an excess adhesive film disposed between the respective semiconductor chips; and removing the respective semiconductor chips from the dicing tape; wherein the portions of the adhesive film which are adhered to the respective semiconductor chips are kept adhered to the respective semiconductor chips and the excess portions of the adhesive film which are subjected to crosslinking and polymerization reactions are left on the dicing tape.

According to another aspect of the present invention, there is provided a manufacturing method of a semiconductor device comprising: dicing a first surface of a semiconductor wafer on which elements have been formed and grinding a rear surface of the semiconductor wafer by a dicing before grinding method to form discrete semiconductor chips; adhering each of the discrete semiconductor chips onto an adhesive film which has a first surface and a second surface and a die bonding agent which comprises thermoplastic resin, unset thermosetting resin or a combination of thermoplastic resin and unset thermosetting resin; affixing to the second surface of the adhesive film a dicing tape; and selectively applying laser light to any portions of an excess adhesive film disposed between the respective semiconductor chips to remove the excess adhesive film.

According to another aspect of the present invention, there is provided a manufacturing method of a semiconductor device comprising: dicing a first surface of a semiconductor wafer on which elements have been formed and grinding a rear surface of the semiconductor wafer by a dicing before grinding method to form discrete semiconductor chips; adhering each of the discrete semiconductor chips onto an adhesive film which has a first surface and a second surface and a die bonding agent which comprises thermoplastic resin, unset thermosetting resin or a combination of thermoplastic resin and unset thermosetting resin; affixing to the second surface of the adhesive film a dicing tape; and removing any portions of the excess adhesive film which is disposed between the respective semiconductor chips by a cutting tool.

According to another aspect of the present invention, there is provided a method for making a semiconductor device comprising: dicing a semiconductor wafer on which elements have been formed on a top surface thereof, and grinding a bottom surface thereof, to form discrete semiconductor chips in the form of wafer; applying an adhesive film to the bottom surface of the wafer; removably adhering dicing tape to the adhesive film; and removing any excess adhesive film between the discrete semiconductor chips of the wafer.

According to another aspect of the present invention, there is provided in a method for making a semiconductor device including dicing a semiconductor wafer on which elements have been formed on a top surface thereof and grinding a bottom surface thereof to form discrete semiconductor chips in the form of a wafer, wherein the improvement comprises: applying an adhesive film to the bottom surface of the wafer; removably adhering dicing tape to the adhesive film; and removing any excess adhesive film between semiconductor chips of the wafer.

According to another aspect of the present invention, there is provided in a method for making a semiconductor device including forming discrete semiconductor chips in the form of a wafer having top and bottom surfaces, wherein the improvement comprises: applying an adhesive film to the bottom surface of the wafer; removably adhering dicing tape to the adhesive film; and removing any excess adhesive film between semiconductor chips of the wafer.

According to another aspect of the present invention, there is provided a semiconductor device produced from a method of making a semiconductor device including forming discrete semiconductor chips in the form of a wafer having a top and a bottom surface, wherein the improvement comprises: applying an adhesive film to the bottom surface of the wafer; removably adhering dicing tape to the adhesive film; and removing any excess adhesive film between the discrete semiconductor chips of the wafer.

According to another aspect of the present invention, there is provided a semiconductor device produced from a method for making a semiconductor device including dicing a semiconductor wafer on which elements having been formed on a top surface thereof and grinding a bottom surface thereof to form discrete semiconductor chips in the form of wafer, wherein the improvement comprises: applying an adhesive film to the bottom surface of the wafer; removably adhering dicing tape to the adhesive film; and removing any excess adhesive film between the discrete semiconductor chips of the wafer.

DETAILED DESCRIPTION OF THE INVENTION

[First Embodiment]

There will now be described a manufacturing method of a semiconductor device according to a first embodiment of this invention with reference to FIGS. 3A to 3E.

First, a wafer on which elements have been formed is discretely divided by a dicing before grinding method. That is, the wafer is diced on the element forming surface side along the dicing lines (or chip dividing lines) of the wafer so as to form grooves with a depth which does not reach the rear surface of the wafer. After this, the wafer is simultaneously made thin and discretely divided by grinding the rear surface of the wafer until at least the grooves are reached.

In regard to the details of the dicing before grinding method, the contents in U.S. Pat. No. 4,722,130 are incorporated herein by reference.

Figure 3A:
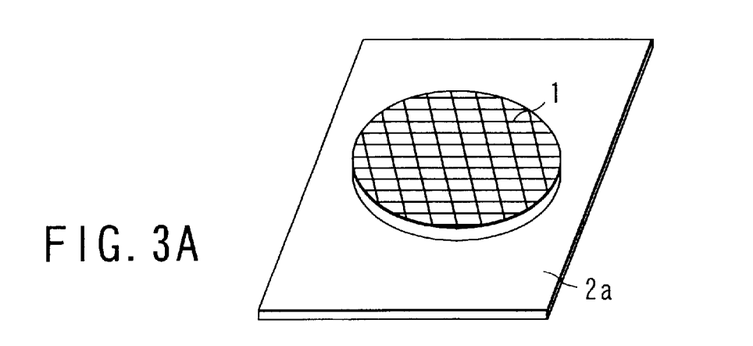
FIGS. 3A and 3B are perspective views for illustrating a manufacturing method of a semiconductor device according to a first embodiment of this invention.
Figure 3B:
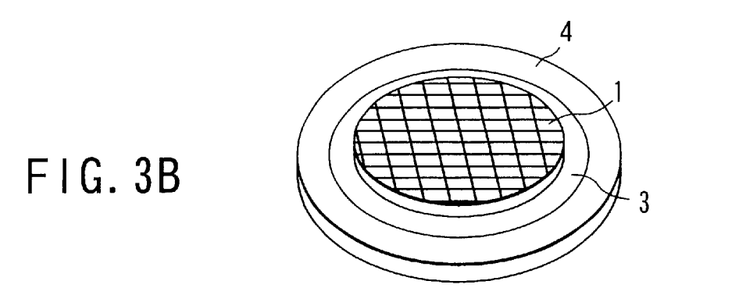
Figure 3C:
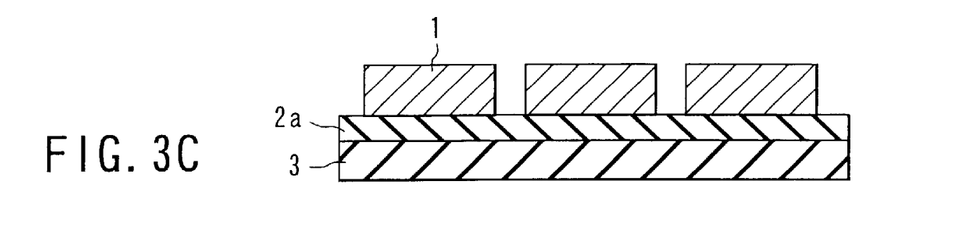
FIGS. 3C to 3E are cross sectional views for illustrating the manufacturing method of the semiconductor device according to the first embodiment of this invention.

Next, as shown in FIG. 3A, a wafer (discretely divided semiconductor chips) 1 divided by the dicing before grinding method is adhered to a film-like adhesive agent (adhesive film) 2a containing a combination of thermoplastic resin and thermosetting resin mainly formed of polyimide at high temperatures by laminating, for example. Then, after a portion of the adhesive film 2a which is not adhered to the wafer 1 is removed, the surface of the adhesive film is laminated on and affixed to a dicing tape 3 mounted on a wafer ring 4 and formed of vinyl chloride, for example, at normal temperatures as shown in FIG. 3B. Thus, as shown in FIG. 3C, the discretely divided wafer portions (semiconductor chips) 1 are affixed to the dicing tape 3 at uniform intervals with the adhesive film 2a disposed therebetween. Each of the semiconductor chips 1 has a size of 6.64 mm×8.58 mm×50 μm (thickness). A chip size of 3 mm to 20 mm length and 50 μm to 200 μm thickness is preferable in the present embodiment.

Figure 3D:
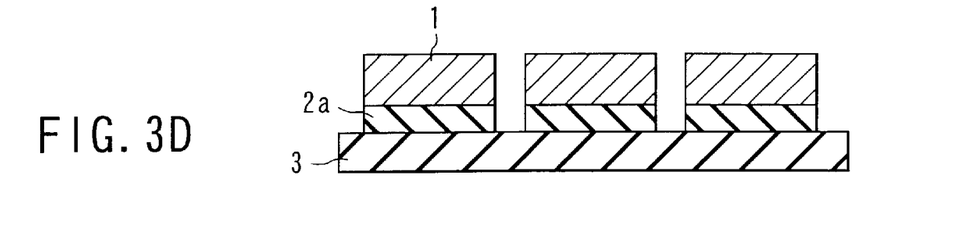

Next, as shown in FIG. 3D, portions of the adhesive film 2a exposed to gaps between the semiconductor chips 1 are chemically etched by use of dimethylacetamide (organic solvent) and thus the portions of the adhesive film 2a which lie in the gaps between the semiconductor chips 1 are removed.

Figure 3E:
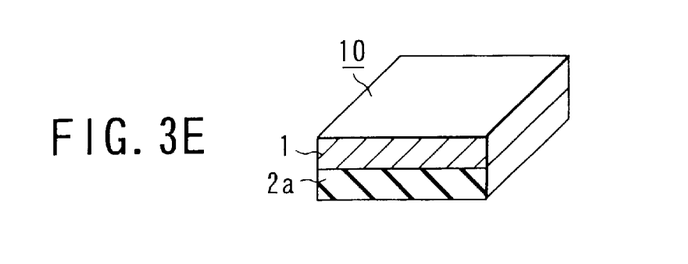

After this, each of the semiconductor chips 1 is pushed upwardly from the rear surface side of the dicing tape 3 and picked up by use of a pickup needle or the like and a semiconductor chip 10 with an adhesive agent as shown in FIG. 3E is formed.

Then, the surface of the semiconductor chip 10 with the adhesive agent on the adhesive film 2a side is pressed against a metal frame or organic substrate and mounted thereon.

According to the above manufacturing method, since the portions of the adhesive film 2a which are exposed to the gaps between the semiconductor chips 1 are chemically etched and removed, it is not necessary to remove the adhesive film 2a by dicing and it becomes possible to suppress the manufacturing process from becoming complicated. Further, since the mounting process can be effected with the adhesive film 2a kept adhered to the semiconductor chip 1, it is not necessary to use a highly precise film sticking machine, the positions of the adhesive film 2a and the semiconductor chip 1 are not deviated from each other and a lowering in the precision of the mounting position can be prevented.

In the first embodiment, a case wherein the adhesive film 2a is an adhesive agent containing a combination of thermoplastic resin and thermosetting resin formed of polyimide is explained as an example, but the adhesive agent can be formed of thermoplastic resin, unset thermosetting resin, a combination of thermoplastic resin and unset thermosetting resin, or one of the above resins containing a spacer formed of glass beads, polymer or silver filler. Further, a case wherein dimethylacetamide which is one type of an organic solvent is used at the time of chemical etching is explained, but another organic solvent, acid solution or alkaline solution may be used according to a material of the adhesive film.

[Second Embodiment]

A manufacturing method of a semiconductor device according to a second embodiment of this invention is explained with reference to FIGS. 4A to 4F.

Figure 4A:
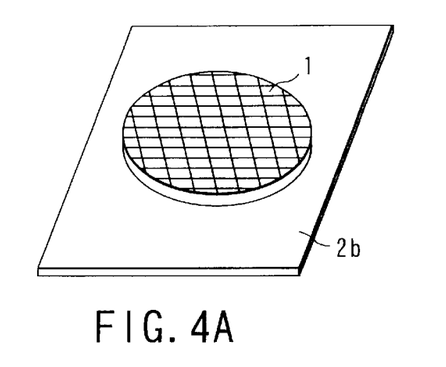
FIGS. 4A and 4B are perspective views for illustrating a manufacturing method of a semiconductor device according to a second embodiment of this invention.
Figure 4B:
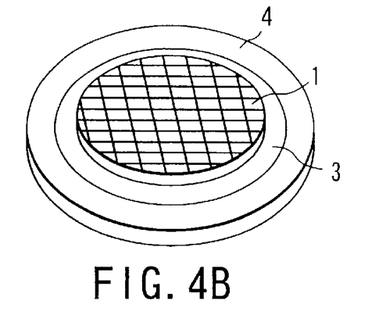
Figure 4C:
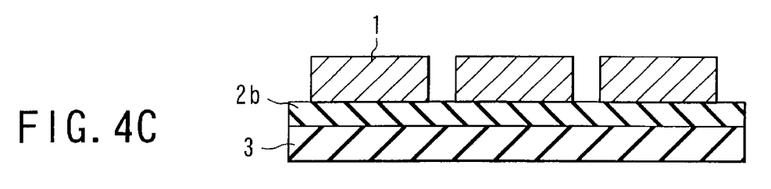
FIGS. 4C to 4F are cross sectional views for illustrating the manufacturing method of the semiconductor device according to the second embodiment of this invention.

The process up to a step of affixing the semiconductor chips 1 onto the dicing tape at equal intervals with the adhesive film disposed therebetween is basically the same as that of the first embodiment shown in FIGS. 3A to 3C. That is, as shown in FIG. 4A, a wafer (discretely divided semiconductor chips) 1 divided by the dicing before grinding method is adhered to a film-like adhesive agent (adhesive film) 2b at high temperatures by laminating. The adhesive film 2b contains a combination of thermoplastic resin and thermosetting resin mainly formed of polyimide, but in the second embodiment, as the thermoplastic resin, resin containing a component having a polymethyl methacrylate structure and depolymerlized by application of UV rays is used. Then, after a portion of the adhesive film 2b which is not adhered to the wafer 1 is removed, the surface of the adhesive film is laminated on and affixed to a dicing tape 3 mounted on a wafer ring 4 and formed of vinyl chloride, for example, at normal temperatures as shown in FIG. 4B. Thus, as shown in FIG. 4C, the semiconductor chips 1 are affixed to the dicing tape 3 at equal intervals with the adhesive film 2b disposed therebetween.

Figure 4D:
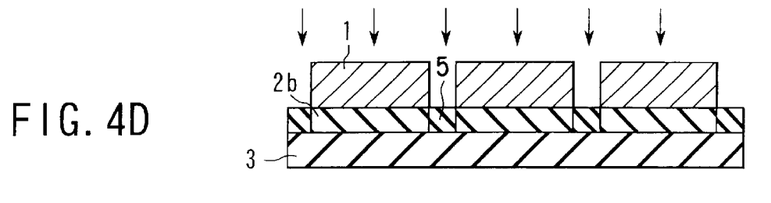
Figure 4E:
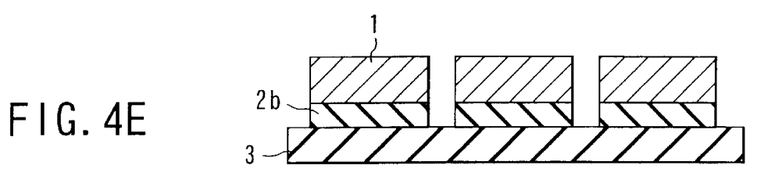

Next, as shown in FIG. 4D, UV rays are applied to the wafer 1 from above to cause a depolymerization reaction in the component of the thermoplastic resin of the adhesive film 2b which lie in gaps between the semiconductor chips 1. After this, portions 5 of the adhesive film 2b which lie in the gaps between the semiconductor chips 1 and in which the depolymerization reaction has occurred are removed by use of ethanol (FIG. 4E).

Figure 4F:
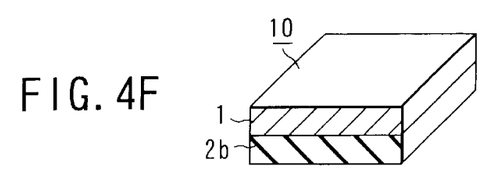

Then, each of the semiconductor chips 1 is pushed upwardly from the rear surface side of the dicing tape 3 and picked up by use of a pickup needle or the like and a semiconductor chip 10 with an adhesive agent as shown in FIG. 4F is formed.

After this, the surface of the semiconductor chip 10 with the adhesive agent on the adhesive film 2b side is pressed against a metal frame or organic substrate and mounted thereon.

According to the above manufacturing method, since the depolymerization reaction is caused in the portions of the adhesive film 2b which are exposed to the gaps between the semiconductor chips 1 to remove the above portions, it is not necessary to remove the adhesive film 2b by dicing and it becomes possible to suppress the manufacturing process from becoming complicated. Further, since the mounting process can be effected with the adhesive film 2b kept adhered to the semiconductor chip 1, it is not necessary to use a highly precise film sticking machine, the positions of the adhesive film 2a and the semiconductor chip 1 are not deviated from each other and a lowering in the precision of the mounting position can be prevented.

The adhesive film 2b may be formed of thermoplastic resin, unset thermosetting resin, a combination of thermoplastic resin and unset thermosetting resin, or one of the above resins containing a spacer formed of glass beads, polymer or silver filler if the resin is a material containing a component in which the depolymerization reaction is caused by application of UV rays. Further, a case wherein the portions 5 which lie in the gaps between the semiconductor chips 1 and in which the depolymerization reaction has occurred are removed by use of ethanol is explained, but another organic solvent, acid solution or alkaline solution may be used according to a material of the adhesive film 2b.

[Third Embodiment]

A manufacturing method of a semiconductor device according to a third embodiment of this invention is explained with reference to FIGS. 5A to 5F.

Figure 5A:
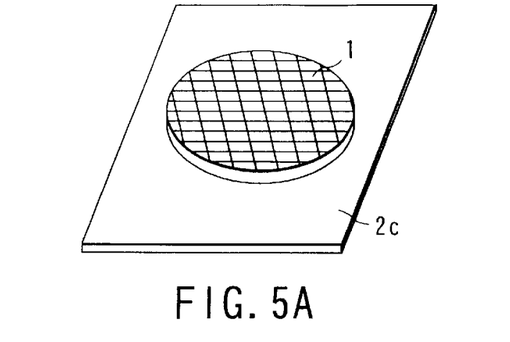
FIGS. 5A and 5B are perspective views for illustrating a manufacturing method of a semiconductor device according to a third embodiment of this invention.

The process up to a step of affixing the semiconductor chips 1 onto the dicing tape at equal intervals with the adhesive film disposed therebetween is basically the same as that of the first embodiment shown in FIGS. 3A to 3C. That is, as shown in FIG. 5A, a wafer (discretely divided semiconductor chips) 1 divided by the dicing before grinding method is adhered to a film-like adhesive agent (adhesive film) 2c containing a combination of thermoplastic resin and thermosetting resin mainly formed of polyimide at high temperatures by laminating. At this time, in the third embodiment, as the thermoplastic resin contained in the adhesive film 2c, resin containing an active ethylene radical in a side chain and causing a crosslinking reaction by application of UV rays is used.

Figure 5B:
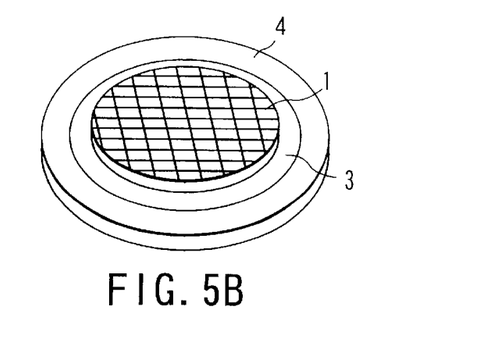

Then, after a portion of the adhesive film 2c which is not adhered to the wafer 1 is removed, the surface of the adhesive film is laminated on and affixed to a dicing tape 3 mounted on a wafer ring 4 and formed of vinyl chloride, for example, at normal temperatures as shown in FIG. 5B. Thus, as shown in FIG. 5C, the semiconductor chips 1 are affixed to the dicing tape 3 at equal intervals with the adhesive film 2c disposed therebetween.

Figures 5C, 5D:
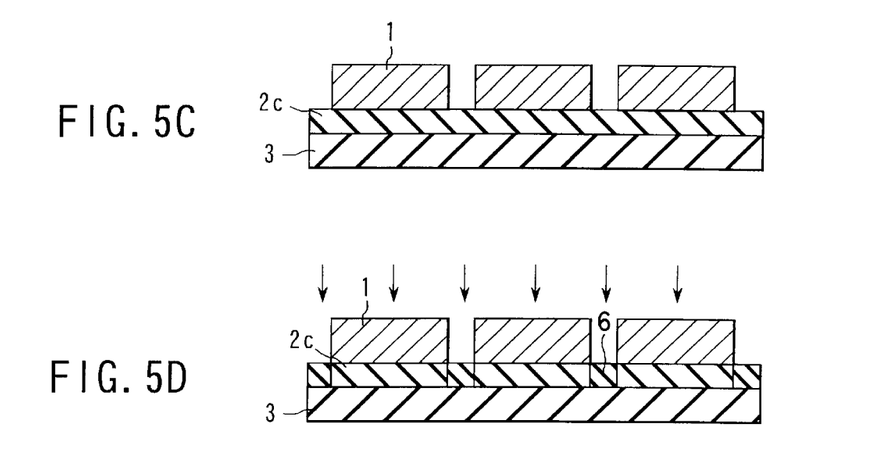
FIGS. 5C to 5F are cross sectional views for illustrating the manufacturing method of the semiconductor device according to the third embodiment of this invention.
Figure 5E:
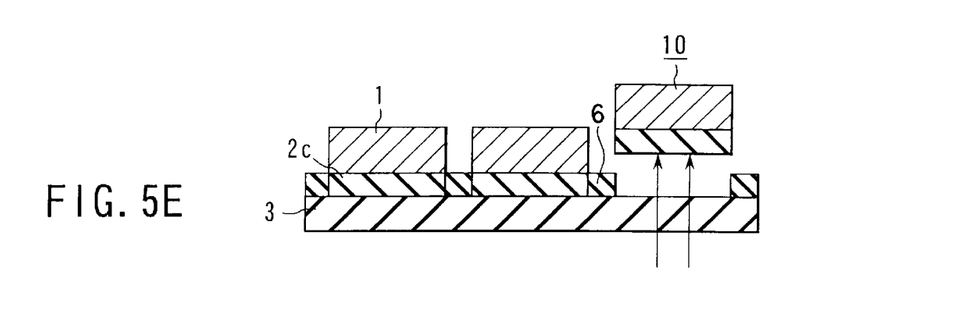

Next, as shown in FIG. 5D, UV rays are applied to the wafer 1 from above to cause a crosslinking reaction in the portions of the adhesive film 2c which lie in gaps between the semiconductor chips 1. After this, each of the semiconductor chips 1 is pushed upwardly from the rear surface side of the dicing tape 3 and picked up by use of a pickup needle or the like and a portion of the adhesive film 2c which is adhered to each semiconductor chip 1 is picked up while the portion of the adhesive film is kept adhered to the semiconductor chip 1 and portions of the adhesive film 2c in which the crosslinking reaction has occurred are left behind on the dicing tape 3 (FIG. 5E).

Figure 5F:
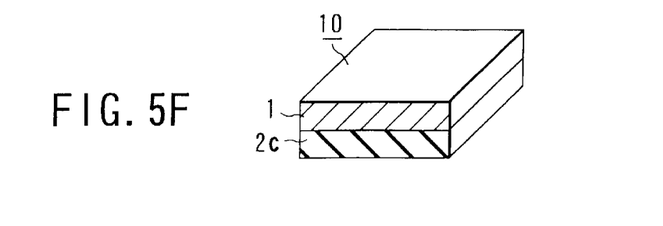

Then, the surface of a semiconductor chip 10 with the adhesive agent on the adhesive film 2c side as shown in FIG. 5F is pressed against a metal frame or organic substrate and mounted thereon.

According to the above manufacturing method, since the portions of the adhesive film 2c which are exposed to the gaps between the semiconductor chips 1 are subjected to the crosslinking reaction (or polymerization reaction) and removed, it is not necessary to remove the adhesive film 2c by dicing and it becomes possible to suppress the manufacturing process from becoming complicated. Further, since the mounting process can be effected with the adhesive film 2c kept adhered to the semiconductor chip 1, it is not necessary to use a highly precise film sticking machine, the positions of the adhesive film 2c and the semiconductor chip 1 are not deviated from each other and a lowering in the precision of the mounting position can be prevented.

[Fourth Embodiment]

A manufacturing method of a semiconductor device according to a fourth embodiment of this invention is explained with reference to FIGS. 6A to 6E.

Figure 6A:
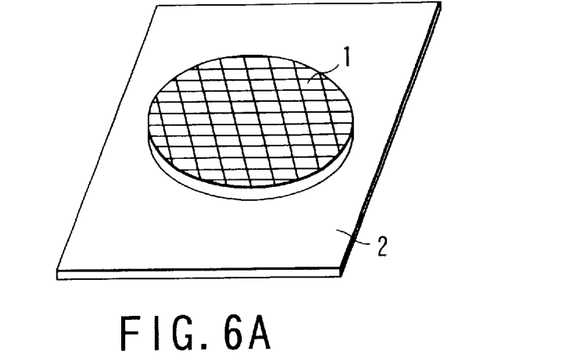
FIGS. 6A and 6B are perspective views for illustrating a manufacturing method of a semiconductor device according to a fourth embodiment of this invention.
Figure 6B:
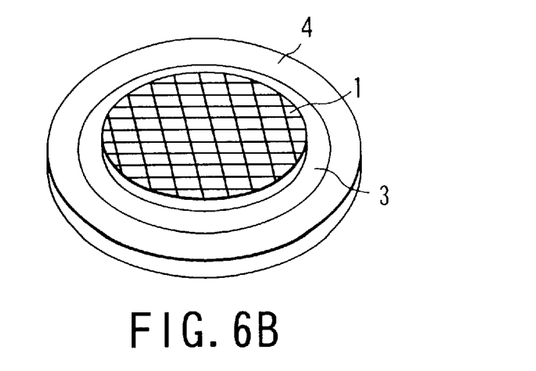
Figure 6C:
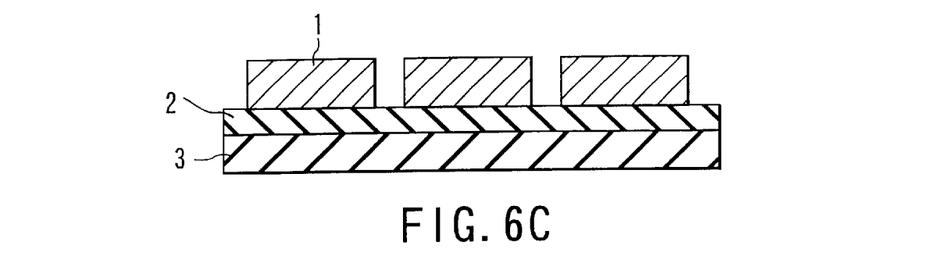
FIGS. 6C to 6E are cross sectional views for illustrating the manufacturing method of the semiconductor device according to the fourth embodiment of this invention.

First, as shown in FIG. 6A, a wafer (discretely divided semiconductor chips) 1 divided by the dicing before grinding method is adhered to a film-like adhesive agent (adhesive film) 2 which contains a combination of thermoplastic resin and thermosetting resin mainly formed of polyimide at high temperatures by laminating. Then, after a portion of the adhesive film 2 which is not adhered to the wafer 1 is removed, the surface of the adhesive film is laminated on and affixed to a dicing tape 3 mounted on a wafer ring 4 and formed of vinyl chloride, for example, at normal temperatures as shown in FIG. 6B. Thus, as shown in FIG. 6C, the semiconductor chips 1 are affixed to the dicing tape 3 at equal intervals with the adhesive film 2 disposed therebetween.

Figure 6D:
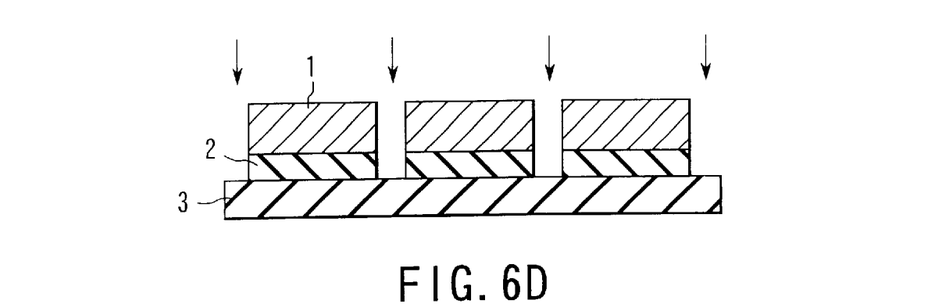

Next, as shown in FIG. 6D, YAG laser light or $CO_2$ laser light is selectively applied to gap portions between the semiconductor chips 1 to remove portions of the adhesive film 2 which lie in the gaps between the semiconductor chips 1.

Figure 6E:
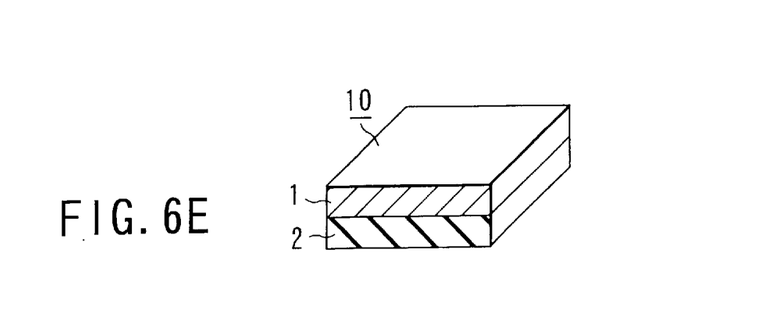

After this, each of the semiconductor chips 1 is pushed upwardly from the rear surface side of the dicing tape 3 and picked up by use of a pickup needle or the like and a semiconductor chip 10 with the adhesive film agent as shown in FIG. 6E is formed.

Then, the surface of the semiconductor chip 10 with the adhesive agent on the adhesive film 2 side is pressed against a metal frame or organic substrate and mounted thereon.

According to the above manufacturing method, since laser light is applied to the portions of the adhesive film 2 which lie in the gaps between the semiconductor chips 1 to remove the above portions, it is not necessary to remove the adhesive film 2 by dicing and it becomes possible to suppress the manufacturing process from becoming complicated. Further, since the mounting process can be effected with the adhesive film 2 kept adhered to the semiconductor chip 1, it is not necessary to use a highly precise film sticking machine, the positions of the adhesive film 2 and the semiconductor chip 1 are not deviated from each other and a lowering in the precision of the mounting position can be prevented.

[Fifth Embodiment]

A manufacturing method of a semiconductor device according to a fifth embodiment of this invention is explained with reference to FIGS. 7A to 7E.

Figure 7A:
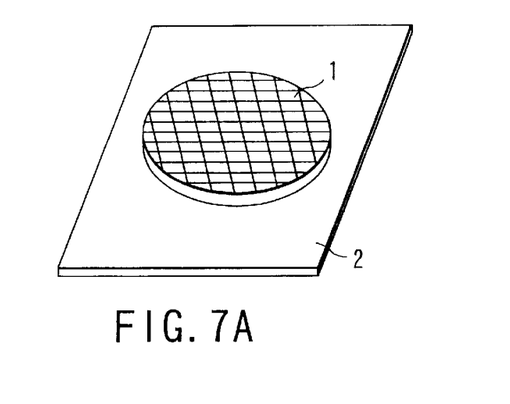
FIGS. 7A and 7B are perspective views for illustrating a manufacturing method of a semiconductor device according to a fifth embodiment of this invention.
Figure 7B:
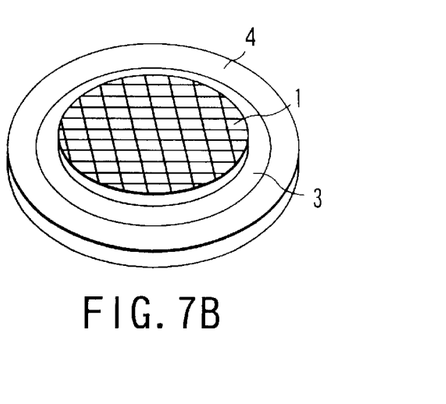
Figure 7C:
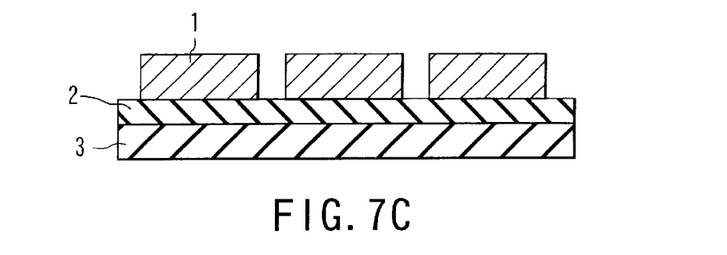
FIGS. 7C to 7E are cross sectional views for illustrating the manufacturing method of the semiconductor device according to the fifth embodiment of this invention.

First, as shown in FIG. 7A, a wafer (discretely divided semiconductor chips) 1 divided by the dicing before grinding method is adhered to a film-like adhesive agent (adhesive film) 2 which contains a combination of thermoplastic resin and thermosetting resin mainly formed of polyimide at high temperatures by laminating. Then, after a portion of the adhesive film 2 which is not adhered to the wafer 1 is removed, the surface of the adhesive film is laminated on and affixed to a dicing tape 3 mounted on a wafer ring 4 and formed of vinyl chloride, for example, at normal temperatures as shown in FIG. 7B. Thus, as shown in FIG. 7C, the semiconductor chips 1 are affixed to the dicing tape 3 at equal intervals with the adhesive film 2 disposed therebetween.

Figure 7D:
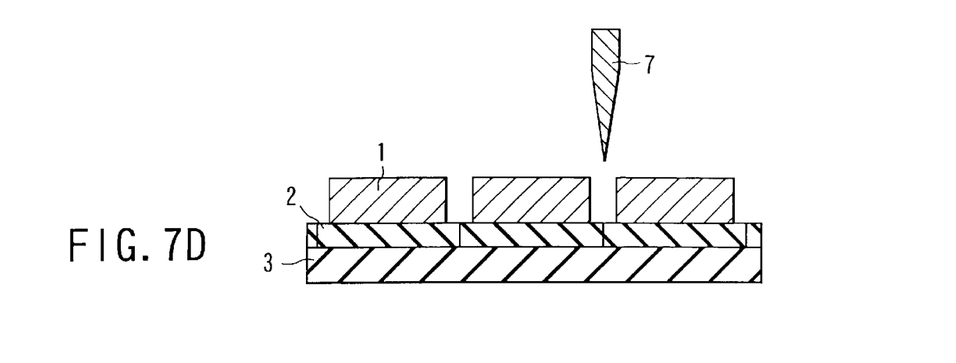

Next, as shown in FIG. 7D, portions of the adhesive film 2 which lie in gaps between the semiconductor chips 1 are cut apart by use of a sharp cutting tool such as a cutter 7 made of iron.

Figure 7E:
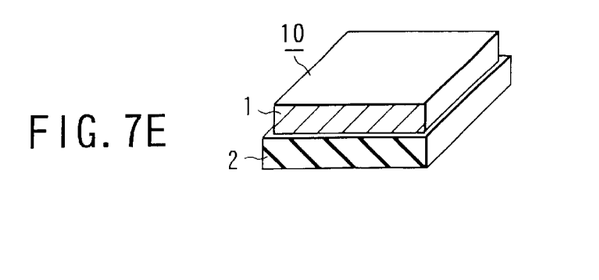

After this, each of the semiconductor chips 1 is pushed upwardly from the rear surface side of the dicing tape 3 and picked up by use of a pickup needle or the like and a semiconductor chip 10 with the adhesive film agent as shown in FIG. 7E is formed.

Then, the surface of the semiconductor chip 10 with the adhesive agent on the adhesive film 2 side is pressed against a metal frame or organic substrate and mounted thereon.

According to the above manufacturing method, since the portions of the adhesive film 2 which lie in the gaps between the semiconductor chips 1 are cut apart by use of the cutter 7, it is not necessary to remove the adhesive film 2 by dicing and it becomes possible to suppress the manufacturing process from becoming complicated. Further, since the mounting process can be effected with the adhesive film 2 kept adhered to the semiconductor chip 1, it is not necessary to use a highly precise film sticking machine, the positions of the adhesive film 2 and the semiconductor chip 1 are not deviated from each other and a lowering in the precision of the mounting position can be prevented.

Conventionally, the manufacturing process becomes complicated if the dicing before grinding method is used when the semiconductor chip with the adhesive agent is formed and the precision of the mounting position is lowered if an attempt is made to prevent the manufacturing process from becoming complicated. However, according to the semiconductor manufacturing methods according to the first to fifth embodiments, the manufacturing process can be simplified without causing a lowering in the precision of the mounting position due to positional deviation between the adhesive film and the semiconductor chip even if the dicing before grinding method is used. The dicing before grinding method is a technique for forming a semiconductor chip thinner than that formed by a normal dicing method. Therefore, a thinner semiconductor chip with an adhesive agent can be formed by applying these embodiments.

As described above, according to aspects of this invention, a manufacturing method of a semiconductor device in which the manufacturing process can be simplified without causing a lowering in the precision of the mounting position due to positional deviation between the adhesive film and the semiconductor chip can be attained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device comprising the steps of:

dicing a semiconductor wafer on which elements have been formed and grinding a rear surface of the semiconductor wafer by a dicing-before-grinding method to form discrete semiconductor chips;

adhering each of the discrete semiconductor chips to an adhesive film having a first surface and a second surface, said adhesive film comprising thermoplastic resin, unset thermosetting resin or a combination of thermoplastic resin and unset thermosetting resin, and said first surface of said adhesive film being adhered to said rear surface of said semiconductor chips;

removably affixing the second surface of the adhesive film to a dicing tape; and removing any excess portions of the adhesive film disposed between the respective semiconductor chips by chemical etching, using one of an organic solvent, an acid solution and an alkaline solution.

2. The manufacturing method of the semiconductor device according to claim 1, wherein the adhesive film consists essentially of thermoplastic resin, unset thermosetting resin, or a combination of thermoplastic resin and unset thermosetting resin.

3. The manufacturing method of the semiconductor device according to claim 1, wherein the adhesive film includes a spacer formed of one of glass beads, polymer and silver filler.

4. The manufacturing method of the semiconductor device according to claim 1, further comprising the steps of:

removing a semiconductor chip from the dicing tape; and contacting a surface of the semiconductor chips having laminated adhesive film with a metal frame or organic substrate, thereby mounting the semiconductor chips on the metal frame or the organic substrate after removing any portions of excess adhesive film disposed between the respective semiconductor chips by a chemical etching process using an organic solvent, an acid solution or an alkaline solution.

* * * * *